United States Patent [19]

Yamazaki et al.

[11] Patent Number: 4,973,975
[45] Date of Patent: Nov. 27, 1990

[54] INITIAL POTENTIAL SETTING CIRCUIT FOR A SAMPLE/HOLD CIRCUIT ASSOCIATED WITH AN A/D CONVERTER

[75] Inventors: Akihiro Yamazaki, Sagamihara; Tomotaka Saito; Hideo Sakai, both of Yokohama, all of Japan

[73] Assignee: Kabushiki Kaisha Toshiba, Kawasaki, Japan

[21] Appl. No.: 390,770

[22] Filed: Aug. 8, 1989

[30] Foreign Application Priority Data

Aug. 12, 1988 [JP] Japan ................................ 63-200009

[51] Int. Cl.$^5$ .............................................. H03M 1/00
[52] U.S. Cl. ................................... 341/122; 341/124; 341/161; 307/353
[58] Field of Search ............... 341/122, 141, 161, 162, 341/163, 164, 165, 172, 124, 125; 330/530, 352, 353

[56] References Cited

U.S. PATENT DOCUMENTS

| | | | |
|---|---|---|---|
| 3,430,225 | 2/1969 | Avignon | 341/165 |
| 3,846,787 | 11/1974 | Myers et al. | 341/161 |
| 4,618,848 | 10/1986 | Parfitt | 341/141 |
| 4,700,022 | 10/1987 | Salvador et al. | 341/158 |

*Primary Examiner*—William M. Shoop, Jr.
*Assistant Examiner*—H. L. Williams
*Attorney, Agent, or Firm*—Finnegan, Henderson, Farabow, Garrett, and Dunner

[57] ABSTRACT

One of analog input voltages applied to a plurality of analog input terminals is selected by means of analog switches connected to the respective analog input terminals and supplied to a common terminal. In this case, each of the analog switches permits selective supply of the potential of a corresponding one of the plurality of analog input terminals in response to a control signal supplied from a controller. The common terminal is connected to the positive input terminal of a comparator. The comparator compares the voltage with a digital output value from the controller which is converted into an analog voltage by means of a D/A converter. Further, the controller generates a preset control signal in an inhibition period during which supply of a voltage from the plurality of analog input terminals to the common terminal is inhibited. An initial potential setting circuit sets the potential of the common terminal to a voltage level equal to substantially one-half the maximum voltage level of the analog input voltages applied to the plurality of analog input terminals.

5 Claims, 5 Drawing Sheets

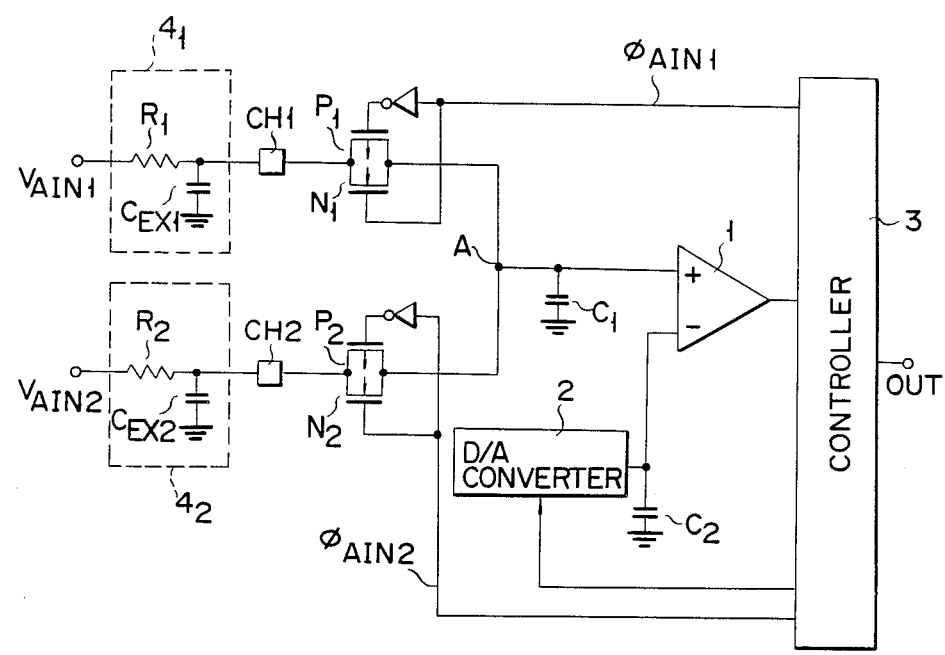
F I G. 1A
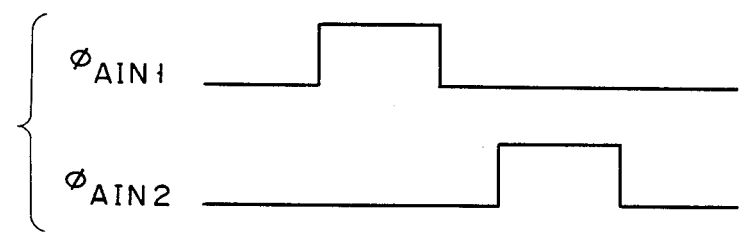
F I G. 1B

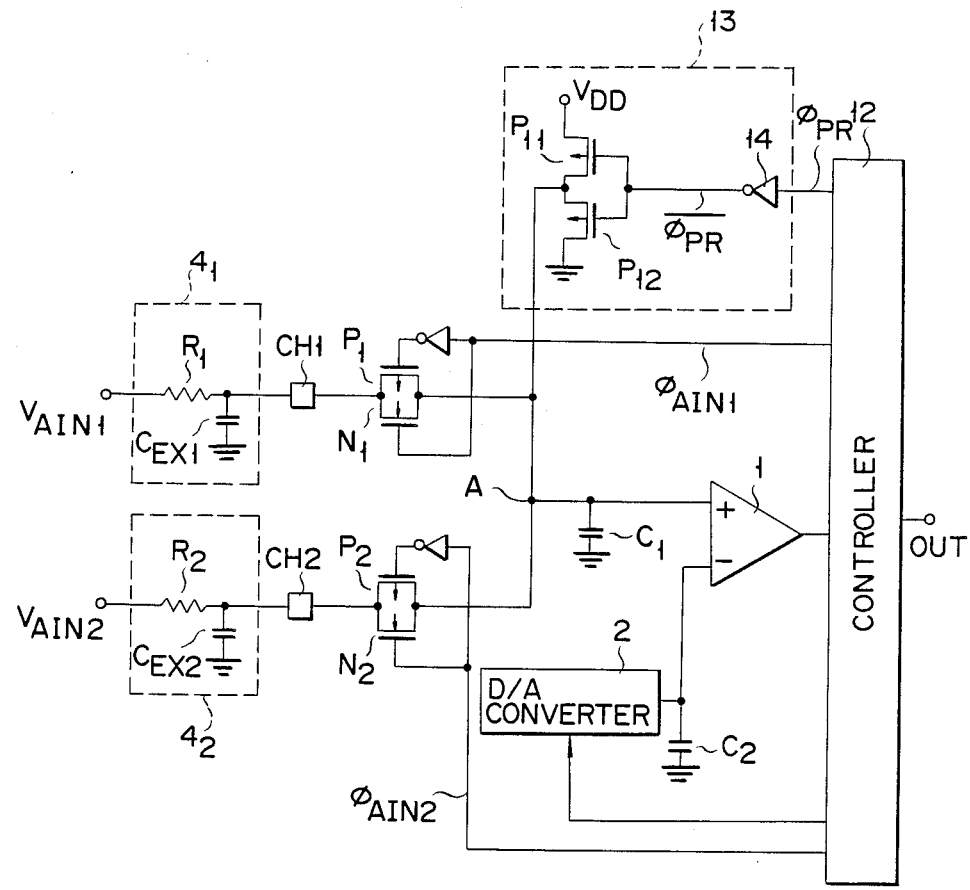
F I G. 3

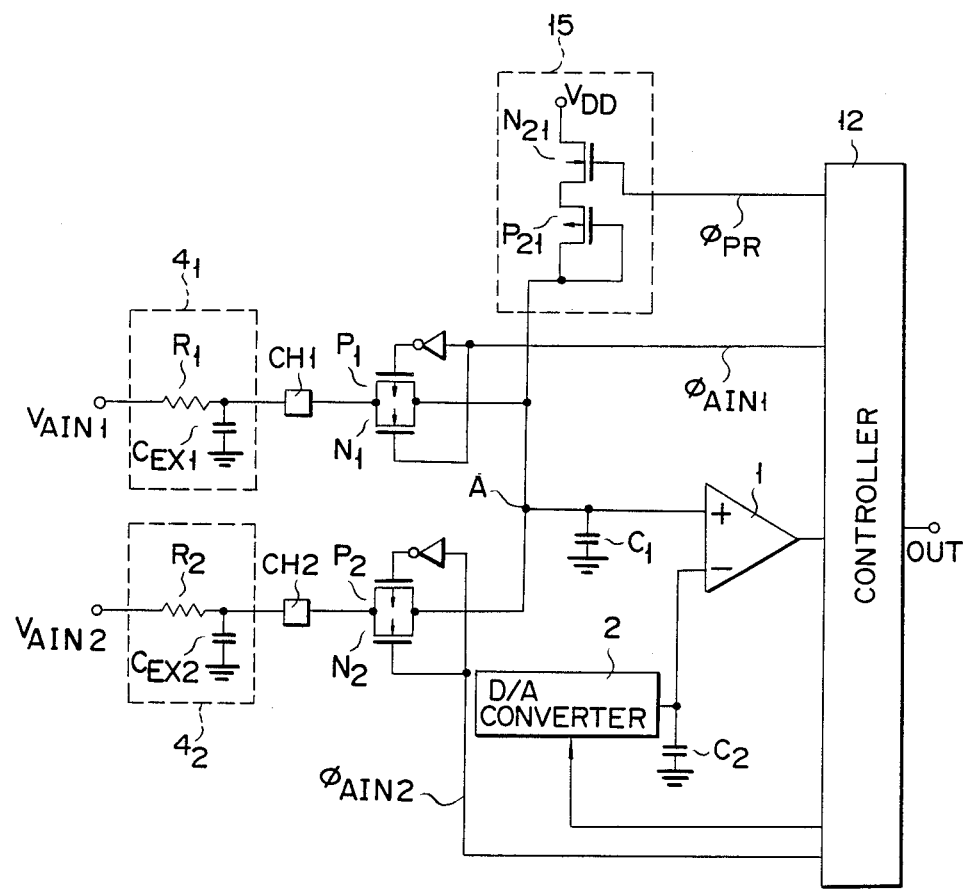
F I G. 4

INITIAL POTENTIAL SETTING CIRCUIT FOR A SAMPLE/HOLD CIRCUIT ASSOCIATED WITH AN A/D CONVERTER

BACKGROUND OF THE INVENTION

1. Field of the Invention

This invention relates to an analog/digital (A/D) converter, and more particularly to an A/D converter having a plurality of analog channels.

2. Description of the Related Art

Various types of A/D converters having a plurality of analog channels are known. FIG. 1A shows the construction of a successive approximation type A/D converter as an example of the above A/D converter in which the number of analog channels is "2", and FIG. 1B shows the timing chart of control signals used in the A/D converter of FIG. 1A.

In FIG. 1A, CH1 and CH2 each denote an analog input terminal. When control signal $\phi_{AIN1}$ is set to a high (H) level, selected analog switches $P_1$ and $N_1$ are turned on, permitting a potential of analog input terminal CH1 to be supplied to the positive input terminal of comparator 1. Further, when control signal $\phi_{AIN2}$ is set to a high (H) level, selected analog switches $P_2$ and $N_2$ are turned on, permitting a potential of analog input terminal CH2 to be supplied to the positive input terminal of comparator 1.

A reference potential which is used as a reference for the comparing operation is supplied to negative input terminal of comparator by means of digital/analog (D/A) converter 2. In this case, comparator effects the comparison operation for one bit (or one cycle of comparison operation) by comparing the potential of analog input terminal CH1 or CH2 selected by the control signal with the reference potential.

After one-bit comparison operation is completed, the comparison result is supplied to controller 3. Controller 3 causes the output of D/A converter 2 to be changed according to the comparison result or whether the comparison result is positive or negative when the compared potentials are not equal to each other. As a result, the potential of the negative input terminal of comparator is changed and then the next comparison operation is effected.

After this, the same operation is repeatedly effected until the compared potentials are determined to be equal to each other. When the compared potentials are set equal to each other, controller 3 supplies a digital value which has been given to D/A converter 2 to output terminal OUT. In this way, the A/D converting operation is effected.

Now, assume that the potential of analog input terminal CH1 is subjected to the A/D conversion and then the potential of analog input terminal CH2 is subjected to the A/D conversion. In this case, as shown by the timing chart of FIG. 1B, a blanking period (in which $\phi_{AIN1} = \phi_{AIN2} =$ low (L) level) is generally provided between signals $\phi_{AIN1}$ and $\phi_{AIN2}$. The reason why such a blanking period is provided is that a D.C. current path must be prevented from being created between analog input terminals CH1 and CH2 by simultaneously turning on analog switches $P_1$ and $N_1$ and analog switches $P_2$ and $N_2$ when signals $\phi_{AIN1}$ and $\phi_{AIN2}$ are switched from one to the other.

In practice, as shown in FIG. 1A, RC filters $4_1$ and $4_2$ are generally connected to analog input terminals CH1 and CH2 in order to stabilize the analog input (or suppress noise). Assume now that the potential of analog input terminal CH1 is completed and analog switches $P_1$ and $N_1$ are turned off. In this case, parasitic capacitor $C_1$ ($C_2$ in FIG. 1A is also a parasitic capacitor) associated with the common terminal (point A) which is the positive input terminal of comparator 1 of FIG. 1A is charged to potential $V_{AIN1}$ of analog input terminal CH1. Immediately after analog switches $P_2$ and $N_2$ are turned on at timing $\phi_{AIN2}$, initial value $V_{A0}$ of the potential of the common terminal (point A) can be determined by the capacitive division (charge sharing) of capacitors $C_1$ and $C_{EX2}$ if the impedance of each of analog switches $P_2$ and $N_2$ is sufficiently smaller than that of resistor $R_2$. That is, the following equation can be obtained:

$$V_{A0} = V_{AIN1} + \frac{C_{EX2}}{C_{EX2} + C_1} (V_{AIN2} - V_{AIN1}) \quad (1)$$

When the potential of capacitor $C_{EX2}$ is changed by the charge sharing, charges are supplied from analog input terminal CH2 to capacitor $C_{EX2}$, thereby preventing the potential variation. However, in practice, the potential of the common terminal (point A) cannot be restored to the level of potential $V_{AIN2}$ of analog input terminal CH2 before the A/D converting operation is completed, particularly, in a case where the time constant of RC filters $4_1$ and $4_2$ is large. In this case, the result of the A/D conversion may contain an error. The error may become larger as the potential difference between potentials $V_{AIN1}$ and $V_{AIN2}$ becomes larger and the capacitance of capacitor $C_1$ becomes larger with respect to that of capacitor $C_{EX2}$.

Basically, it is impossible to eliminate the influence by the charge sharing and therefore it becomes important to suppress the potential variation. That is, the influence by the charge sharing ca be observed in the form of on-channel input current and therefore it is important to suppress the on-channel input current to a minimum and attain the highly precise A/D conversion.

SUMMARY OF THE INVENTION

An object of this invention is to provide an A/D converter in which the analog input potential in a comparator can be prevented from being deviated from the potential of a selected analog channel by the charge sharing when the analog input channel is switched, that is, the on-channel input current of the analog input channel can be suppressed to a minimum.

An A/D converter according to this invention comprises a plurality of analog input terminals to which analog input voltages are respectively applied; switching means for selectively supplying the voltage level of the analog input voltages applied to the plurality of analog input terminals to a common terminal; control means for controlling selection of the plurality of analog input terminals by the switching means, the controlling means changing the selecting operation in an inhibition period during which supply of the voltage level from the plurality of analog input terminals to the common terminal is inhibited; comparing means for comparing the voltage of the common terminal with a reference voltage; and initial potential setting means for setting the potential of the common terminal to a desired potential level in the inhibition period.

BRIEF DESCRIPTION OF THE DRAWINGS

FIG. 1A is a circuit diagram of the conventional A/D converter;

FIG. 1B is a timing chart of control signals used in the A/D converter of FIG. 1A;

FIG. 3 is a circuit diagram of an A/D converter according to a second embodiment of this invention;

FIG. 4 is a circuit diagram of an A/D converter according to a third embodiment of this invention.

DETAILED DESCRIPTION OF THE PREFERRED EMBODIMENTS

There will now be described first to fourth embodiments of this invention with reference to FIGS. 2A to 5.

Figure 2A:
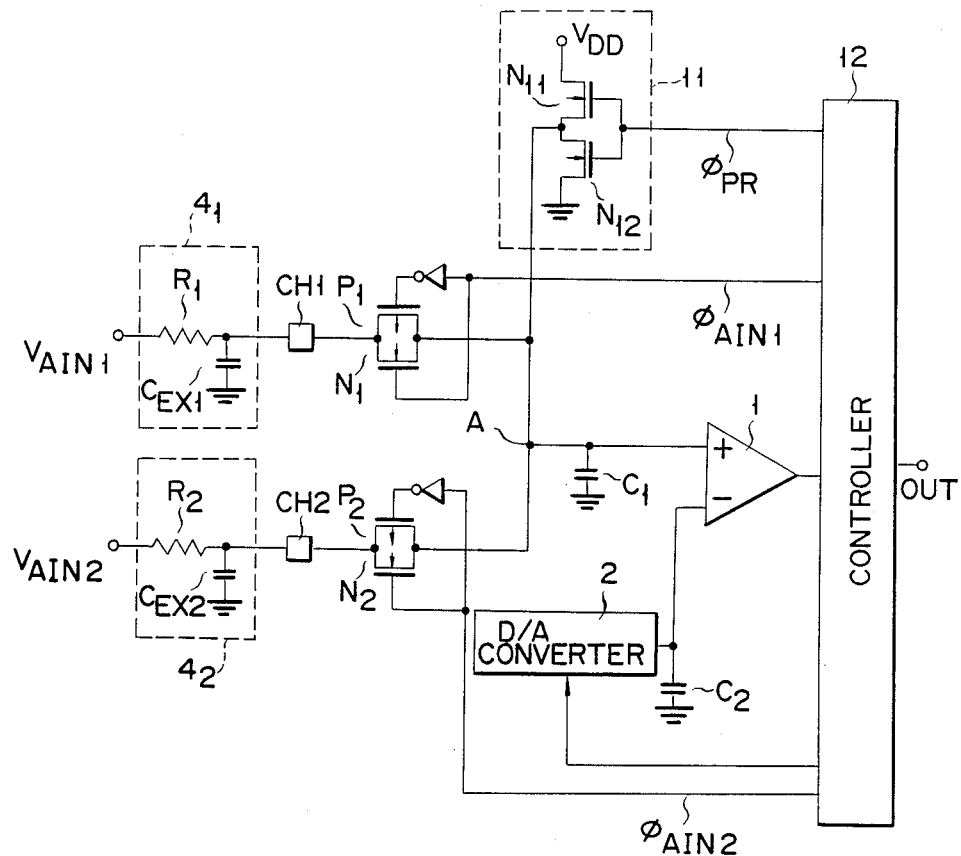
FIG. 2A is a circuit diagram of an A/D converter according to a first embodiment of this invention.
Figure 2B:
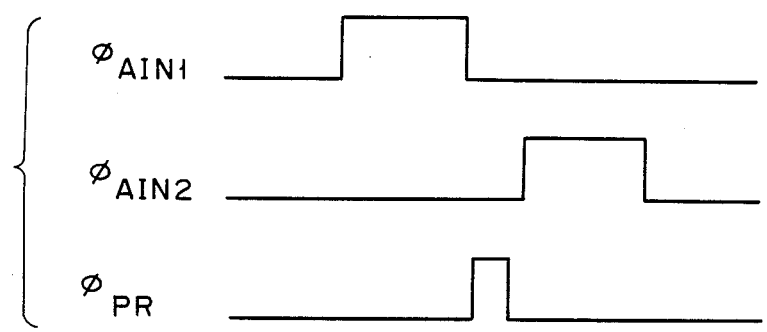
FIG. 2B is a timing chart of control signals used in the A/D converter of FIG. 2A.
Figure 5:
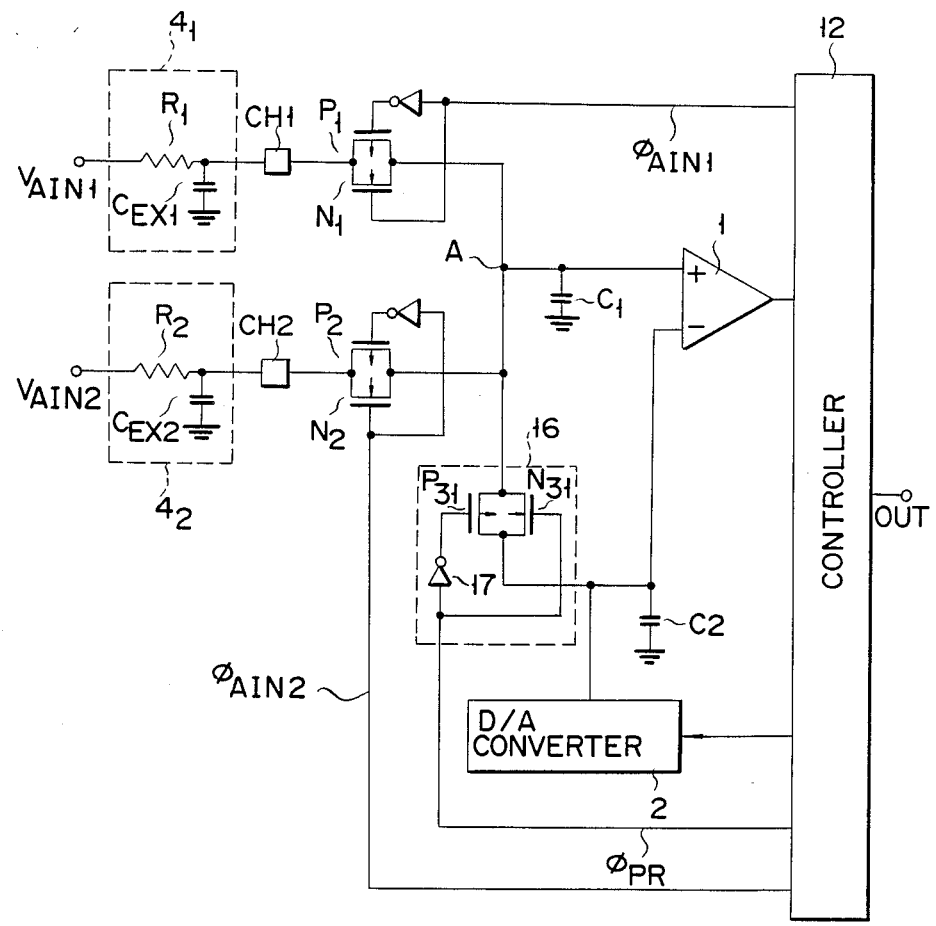
FIG. 5 is a circuit diagram of an A/D converter according to a fourth embodiment of this invention.

First, the first embodiment of this invention is explained with reference to FIGS. 2A and 2B which correspond to FIGS. 1A and 1B showing the conventional A/D converter. That is, the A/D converter is a successive approximation type A/D converter of two input channels and includes two analog input terminals CH1 and CH2 as shown in FIG. 2A. Analog potential $V_{AIN1}$ is applied to analog input terminal CH1 via RC filter $4_1$ constituted by resistor $R_1$ and capacitor $C_{EX1}$. Likewise, analog potential $V_{AIN2}$ is applied to analog input terminal CH2 via RC filter $4_2$ constituted by resistor $R_2$ and capacitor $C_{EX2}$.

Analog input terminal CH1 is connected to the positive input terminal of comparator 1 via analog switches $P_1$ and $N_1$ which are turned on or off by first control signal $\phi_{AIN1}$ from controller 12. Likewise, analog input terminal CH2 is connected to the positive input terminal of comparator via analog switches $P_2$ and $N_2$ which are turned on or off by second control signal $\phi_{AIN2}$ from controller 12. As shown in FIG. 2B, a blanking period (in which $\phi_{AIN1} = \phi_{AIN2} = $ "L" level) is set between first and second control signals $\phi_{AIN1}$ and $\phi_{AIN2}$ in order to prevent a D.C. current path from being formed between analog input terminals CH1 and CH2 by simultaneously turning on switches $P_1$ and $N_1$ and switches $P_2$ and $N_2$ when signals $\phi_{AIN1}$ and $\phi_{AIN2}$ are switched from one to the other. Therefore, when first control signal $\phi_{AIN1}$ is set to "H" level, selected analog switches $P_1$ and $N_1$ are turned on, permitting the potential of analog input terminal CH1 to be supplied to the positive input terminal of comparator 1. Likewise, when second control signal $\phi_{AIN2}$ is set to "H" level, selected analog switches $P_2$ and $N_2$ are turned on, permitting the potential of analog input terminal CH2 to be supplied to the positive input terminal of comparator 1.

A reference potential serving as a comparison reference and generated from D/A converter 2 for D/A converting a digital value output from controller 12 is supplied to the negative input terminal of comparator 1. Comparator 1 effects one-bit comparison operation (or one cycle of comparing operation) by comparing the potential of analog input switch CH1 or CH2 selected by first and second control signals $\phi_{AIN1}$ and $\phi_{AIN2}$ with the reference potential.

After the one-bit comparison operation is completed, the comparison result is supplied to controller 12. Controller 12 changes the output potential of D/A converter 2 according to the comparison result or whether it is positive or negative when the compared potentials are not equal to each other. As a result, the potential of the negative input terminal of comparator 1 is changed and then the next bit comparison operation is effected.

After this, the same operation is repeatedly effected until the compared potentials are determined to be equal to each other. When the compared potentials are determined to be equal to each other, controller 12 outputs a digital value which has been given to D/A converter 2 to output terminal OUT. In this way, the A/D conversion is effected.

The positive input terminal of comparator 1, or common terminal (point A) in FIG. 2A, is connected to initial potential setting circuit 11. Initial potential setting circuit 11 includes two N-channel transistors $N_{11}$ and $N_{12}$ serially connected between power source $V_{DD}$ and the ground terminal. A connection node between transistors $N_{11}$ and $N_{12}$ is connected to the common terminal (point A). The gates of transistors $N_{11}$ and $N_{12}$ are supplied with third control signal $\phi_{PR}$ as shown in FIG. 2B from controller 12. That is, initial potential setting circuit 11 creates an initial potential of an intermediate potential level between power source potential $V_{DD}$ and the ground potential which is determined by the resistance ratio of N-channel transistors $N_{11}$ and $N_{12}$ which are both turned on during the blanking period in the case of switching the analog input signals or while third control signal $\phi_{PR}$ between the high-level periods of first and second control signals $\phi_{AIN1}$ and $\phi_{AIN2}$ is kept at "H" level. The initial potential is also set as initial potential $V_{INITIAL}$ of the common terminal (point A).

That is, in the case of FIG. 2A, initial potential $V_{INITIAL}$ of the common terminal (point A) can be expressed as follows:

$$V_{INITIAL} = V_{DD} \times \frac{R_{N1}}{R_{N1} + R_{N2}} \quad (2)$$

where $R_{N1}$ denotes the ON-resistance of N-channel transistor $N_{11}$ and $R_{N2}$ denotes the ON-resistance of N-channel transistor $N_{12}$.

As is clearly understood from equation (2), initial potential $V_{INITIAL}$ of the common terminal (point A) can be set to ($\frac{1}{2}$) $V_{DD}$ by selectively setting the ON-resistances of N-channel transistors $N_{11}$ and $N_{12}$ equal to each other.

In the conventional A/D converter shown in FIG. 1A, when analog input terminal CH2 is selected instead of analog input terminal CH1, or when the analog input potential is switched from $V_{AIN1}$ to $V_{AIN2}$, positive input potential $V_{A0}$ of comparator can be expressed by equation (1) as follows:

$$V_{A0} = V_{AIN1} + \frac{C_{EX2}}{C_{EX2} + C_1}(V_{AIN2} - V_{AIN1}) \quad (1)$$

Therefore, when the analog input potential is switched from $V_{AIN1} = 0$ V to $V_{AIN2} = 5$ V, positive input potential $V_{A0}$ of comparator can be expressed as follows:

$$V_{A0} = 0 + \frac{C_{EX2}}{C_{EX2} + C_1}(5 - 0) = \frac{C_{EX2}}{C_{EX2} + C_1} \times 5 \quad (3)$$

In contrast, in this embodiment, desired initial potential $V_{INITIAL}$ can be set by means of initial potential setting circuit 11. That is, when the analog input potential is switched from $V_{AIN1}$ to $V_{AIN2}$, initial potential $V_{INITIAL}$ which is determined by means of initial potential setting circuit 11 is set instead o input potential input potential $V_{AIN1}$. Therefore, if initial potential $V_{INITIAL}$ which is determined by means of initial potential setting circuit 11 is set to 2.5 V, for example, positive input potential $V_{A0}$ of comparator 1 can be expressed as follows:

$$V_{A0} = 2.5 + \frac{C_{EX2}}{C_{EX2}+C_1}(5-2.5) \qquad (4)$$
$$= 2.5 + \frac{C_{EX2}}{C_{EX2}+C_1} \times 2.5$$

Assuming that capacitance $C_1 = 1$ PF and capacitance $C_{EX2} = 100$ PF, equation (3) can be rewritten as follows:

$$V_{A0} = 100/(100+1) \times 5 \approx 4.95 \text{ V}$$

and equation (4) can be rewritten as follows:

$$V_{A0} = 2.5 + 100/(100+1) \times 2.5 \approx 4.98 \text{ V}$$

As is clearly understood from the above, the analog input potential to comparator in the conventional A/D converter is varied by 50 mV (5 V−4.95 V=0.05 V) by the charge sharing. In contrast, in the A/D converter of this embodiment, variation in the analog input potential can be suppressed to 20 mV (5 V−4.98 V=0.02 V). In other words, since a potential difference of 5 V which is the analog input potential range for the A/D conversion may occur between input potentials $V_{AIN1}$ and $V_{AIN2}$ in the conventional A/D converter, a maximum potential difference caused by the charge sharing will be as much as 5 V. In contrast, since the input potential is initially set to an intermediate potential, for example, 2.5 V during the blanking period in the A/D converter of this embodiment, a potential difference caused by the charge sharing may be only 2.5 V at maximum. Therefore, in the A/D converter of this embodiment, variation in the analog input potential of comparator can be suppressed, that is, an error can be suppressed and an ON-channel input current in the analog input channel can be reduced, thereby making it possible to enhance the operation speed. In this case, it is preferable to set initial potential $V_{INITIAL}$ determined by means of initial potential setting circuit 11 to one-half the voltage which is equal to the analog input potential range for the A/D conversion. That is, it is preferable to set the initial potential to a potential level equal to one-half the rated input voltage.

FIG. 3 is a circuit diagram of an A/D converter according to the second embodiment of this invention. The A/D converter of this embodiment includes initial potential setting circuit 13 constituted by P-channel transistors $P_{11}$ and $P_{12}$ instead of initial potential setting circuit 11 of the A/D converter shown in FIG. 2A. That is, initial potential setting circuit 13 includes two P-channel transistors $P_{11}$ and $P_{12}$ connected between power source VDD and the ground terminal. A connection node between two transistors $P_{11}$ and $P_{12}$ is connected to the common terminal (point A). Initial potential setting circuit 13 further includes inverter 14. Third control signal $\phi_{PR}$ supplied from controller 12 and shown in FIG. 2B is inverted by inverter 14 and supplied as control signal $\overline{\phi_{PR}}$ to the gates of transistors $P_{11}$ and $P_{12}$. That is, in initial potential setting circuit 13, when third control signal $\phi_{PR}$ in the blanking period at the switching time of analog input signals is set at "H" level or when control signal $\overline{\phi_{PR}}$ is set at "L" level, P-channel transistors $P_{11}$ and $P_{12}$ are both turned on to create an initial potential equal to a desired intermediate potential which lies between power source potential VDD and the ground potential and which is determined by the resistance ratio of transistors $P_{11}$ and $P_{12}$. The initial potential is used as initial potential $V_{INITIAL}$ of the common terminal (point A).

Since initial potential $V_{INITIAL}$ of the common terminal (point A) can be freely set to a desired value by means of initial potential setting circuit 13, the same effect as is obtained in the first embodiment can be attained by setting initial potential $V_{INITIAL}$ to 2.5 V, or one-half of 5 V which is the analog input potential range for the A/D conversion.

FIG. 4 is a circuit diagram of an A/D converter according to the third embodiment of this invention. The A/D converter of this embodiment includes initial potential setting circuit 15. Initial potential setting circuit 15 is constituted by N-channel transistor $N_{21}$ and P-channel transistor $P_{21}$ serially connected between power source $V_{DD}$ and the common terminal (point A). The gate of transistor $P_{21}$ is also connected to the common terminal (point A). Further, the gate of transistor $N_{21}$ is supplied with third control signal $\phi_{PR}$ shown in FIG. 2B from controller 12. That is, in initial potential setting circuit 15, the potential of point A (parasitic capacitance $C_1$) is initially set to a desired intermediate potential level between power source potential $V_{DD}$ and the ground potential when third control signal $\phi_{PR}$ in the blanking period at the switching time of analog input signals is set at "H" level.

With initial potential setting circuit 15, initial potential $V_{INITIAL}$ at point A can be expressed as follows:

$$V_{INITIAL} = V_{DD} - (V_{thn21} + \Delta V_{thn21}) - V_{thp21} \qquad (5)$$

where $V_{thn21}$ and $V_{thp21}$ respectively denote threshold voltages of transistors $N_{21}$ and $P_{21}$, and $\Delta V_{thn21}$ denotes an amount of variation in threshold voltage $V_{th}$ due to the back-gate bias effect.

For example, in initial potential setting circuit 15, initial potential $V_{INITIAL}$ can be set approx. to $(\frac{1}{2})V_{DD}$ as indicated by the following equation:

$$V_{INITIAL} = 5 \text{ V} - (0.8 \text{ V} + 1 \text{ V}) - 0.8 \text{ V} = 2.4 \text{ V}$$

As described above, with initial potential setting circuit 15, initial potential $V_{INITIAL}$ of the common terminal (point A) can be set to a desired value, and therefore the same effect as that obtained in the first embodiment can be obtained by setting initial potential $V_{INITIAL}$ to 2.4 V, or approximately one-half of 5 V which is the analog input potential range for the A/D conversion.

FIG. 6 is a circuit diagram of an A/D converter according to the fourth embodiment of this invention. The A/D converter of this embodiment includes initial potential setting circuit 16 which is constituted by analog switches $N_{31}$ and $P_{31}$ connected between D/A converter 2 and point A. The analog switches are supplied with third control signal $\phi_{PR}$ as shown in FIG. 2B and control signal $\phi_{PR}$ obtained by inverting control signal $\overline{\phi_{PR}}$ means of inverter 17. That is, in initial potential setting circuit 16, when third control signal $\phi_{PR}$ in the blanking period at the time of switching the analog input signals is set at "H" level, analog switches $N_{31}$ and $P_{31}$ are both turned on, permitting the output potential of D/A converter 2 to be supplied to the common terminal (point A). Since the output potential of D/A converter 2 can be set to a desired value according to a digital value supplied from controller 12, potential $V_{INITIAL}$ of the common terminal (point A) can also be set to a desired value.

With initial potential setting circuit 16, since initial potential $V_{INITIAL}$ of the common terminal (point A) can be set to a desired value, the same effect as that obtained in the first embodiment can be obtained by setting initial potential $V_{INITIAL}$ to 2.5 V, or one-half of 5 V which is the analog input potential range for the A/D conversion.

It is possible to form various types of initial potential setting circuits with other constructions. Further, the first to third control signals may be generated in a software or hardware fashion instead of using the above controller. It should be understood that this invention is not limited to the 2-input channel successive approximation type A/D converter shown in the above embodiments. This invention can be applied if a plurality of input channels are used. Further, this invention can be applied to a flash A/D converter or another type of A/D converter which uses a plurality of comparators for comparing an input signal with the respective reference potentials instead of using the D/A converter and controller to generate the reference potential.

As described above, according to the A/D converter of this invention, a positive input to the comparator (or the parasitic capacitance of the input terminal thereof) is previously set to an initial potential level in the blanking period of the control signal at the time of switching the analog input signals so as to suppress variation in the potential due to the charge sharing. Recently, the precision and operation speed of the A/D converter becomes higher and therefore influence of the charge sharing on the conversion precision cannot be neglected. However, according to this invention, influence of the charge sharing can be effectively reduced only by additionally using a simple initial potential setting circuit and the like without necessitating a complicated timing control.

What is claimed is:

1. An analog to digital converter comprising:
a plurality of analog input terminals to which analog input voltages are respectively applied.
switching means for selectively supplying the voltage level of the analog input voltages applied to said plurality of analog input terminals to a common terminal;
control means for controlling selection of said plurality of analog input terminals by said switching means, said control means changing the selecting operation in an inhibition period during which supply of the voltage level from said plurality of analog input terminals to said common terminal is inhibited;
comparing means for comparing the voltage of said common terminal with a reference voltage; and
initial potential setting means for setting the potential of said common terminal to a desired potential level in the inhibition period; and wherein
said control means includes control signal generating means for generating a control signal indicating the inhibition period;
said initial potential setting means sets the potential of said common terminal to a desired potential level according to the control signal; and
said initial potential setting means includes first and second transistors of the same conductivity type serially connected between a power source set at a preset potential and a ground terminal, the gates of said first and second transistors being coupled to said control signal generating means, and a connection node between said first and second transistors being connected to said common terminal.

2. The analog to digital converter according to claim 1, wherein said first and second transistors are N-channel transistors, and the gates of said first and second N-channel transistors are connected to said control signal generating means to receive the control signal.

3. The analog to digital converter according to claim 2, wherein said first and second transistors are P-channel transistors, and said initial potential setting means includes an inverter connected to the gates of said first and second Pchannel transistors, said inverter being connected to said control signal generating means to receive the control signal and supply an inverted signal of the control signal to the gates of said first and second P-channel transistors.

4. An analog to digital converter comprising:
a plurality of analog input terminals to which analog input voltages are respectively applied;
switching means for selectively supplying the voltage level of the analog input voltages applied to said plurality of analog input terminals to a commmon terminal;
control means for controlling selection of said plurality of analog input terminals by said switching means, said control means changing the selecting operation in an inhibition period during which supply of the voltage level from said plurality of analog input terminals to said common terminal is inhibited;
comparing means for comparing the voltage of said common terminal with a reference voltage; and
initial potential setting means for setting the potential of said common terminal to a desired potential level in the inhibition period; and wherein
said control means includes control signal generating means for generating a control signal indicating the inhibition period;
said initial potential setting means sets the potential of said common terminal to a desired potential level according to the control signal; and
said initial potential setting means includes an N-channel transistor and a P-channel transistor serially connected between a power source set at a preset potential and said common terminal, the gate of said N-channel transistor being connected to said control signal generating means to receive the control signal and the gate of said P-channel transistor being connected to said common terminal.

5. An analog to digital converter comprising:
a plurality of analog input terminals to which analog input voltages are respectively applied;

switching means for selectively supplying the voltage level of the analog input voltages applied to said plurality of analog input terminals to a common terminal;

control means for controlling selection of said plurality of analog input terminals by said switching means, said control means changing the selecting operation in an inhibition period during which supply of the voltage level from said plurality of analog input terminals to said common terminal is inhibited;

comparing means for comparing the voltage of said common terminal with a reference voltage;

initial potential setting means for setting the potential of said common terminal to a desired potential level in the inhibition period;

digital value generating means for generating a digital value corresponding to the comparisons result of said comparator means; and a digital to analog converter for converting the digital value generated from said digital value generating means into an analog voltage and supplying the converted analog signal to said comparator means as the reference voltage; and wherein said control means includes control signal generating means for generating a control signal indicating the inhibition period;

said initial potential setting means sets the potential of said common terminal to a desired potential level according to the control signal;

said initial potential setting means includes an N-channel transistor constituting an analog switch and a P-channel transistor constituting an analog switch which are connected in parallel between said digital to analog converter and said common terminal and an inverter connected to the gate of said P-channel transistor; and the gate of said N-channel transistor is connected to said control signal generating means to receive the control signal, the gate of said P-channel transistor is connected to said inverter which is connected to said control signal generating means and supplies an inverted signal of the control signal.

* * * * *

UNITED STATES PATENT AND TRADEMARK OFFICE
CERTIFICATE OF CORRECTION

PATENT NO. : 4,973,975
DATED : November 27, 1990
INVENTOR(S) : Akihiro Yamazaki, et al.

It is certified that error appears in the above-identified patent and that said Letters Patent is hereby corrected as shown below:

Claim 1, Column 7, Line 55, change "." to --;--;

Claim 3, Column 8, Line 27, change "Pchannel" to --P-channel--;

Claim 4, Column 8, Line 38, change "commmon" to --common--;

Claim 5, Column 9, Line 18, change "comparisons" to --comparison--.

Signed and Sealed this

Twelfth Day of January, 1993

Attest:

DOUGLAS B. COMER

*Attesting Officer*  Acting Commissioner of Patents and Trademarks